(12) United States Patent
Paritsky et al.

(10) Patent No.: US 6,740,862 B2
(45) Date of Patent: May 25, 2004

(54) OPTICAL TRANSDUCERS AND METHODS OF MAKING SAME

(75) Inventors: Alexander Paritsky, Modi'in (IL); Alexander Kots, Ashdod (IL)

(73) Assignee: Phone-Or Ltd., Or Yehuda (IL)

( * ) Notice: Subject to any disclaimer, the term of this patent is extended or adjusted under 35 U.S.C. 154(b) by 219 days.

(21) Appl. No.: 10/095,990

(22) Filed: Mar. 13, 2002

(65) Prior Publication Data

US 2003/0173506 A1 Sep. 18, 2003

(51) Int. Cl.[7] .............................. H01J 5/16; H01J 40/14; H01L 29/16; H01L 31/0203
(52) U.S. Cl. ...................... 250/221; 250/239; 250/216; 257/82; 257/433; 257/434; 257/435
(58) Field of Search ................................. 250/216, 221, 250/239; 257/82, 98, 99, 432, 433, 434, 435

(56) References Cited

U.S. PATENT DOCUMENTS 5,771,091 A    6/1998  Paritsky et al.
5,969,858 A   10/1999  Funatsu
6,091,497 A    7/2000  Paritsky et al.
6,239,865 B1   5/2001  Paritsky et al.

Primary Examiner—David Porta
Assistant Examiner—David C Meyer
(74) Attorney, Agent, or Firm—G.E. Ehrlich (1995) Ltd.

(57) ABSTRACT

An optical transducer includes a base member, a light source carried on a face of the base member, a light detector carried on the face of the base member laterally spaced from the light source, an optical shield extending from the face of the base member between the light source and light detector, and a displaceable member overlying, and spaced from, the light source, light detector and optical shield, and effective to reflect light from the light source to the light detector. The optical shield includes a transparent plate extending from the face of the base member between the light source and light detector, and carrying a thin layer of a light-blocking material to shield the light detector from direct exposure to the light source. The light source, light detector, and optical shield are all embedded in a transparent plastic potting material. Also described is a method of making such optical transducers by producing an intermediate matrix of a plurality of such light sources, light detectors and optical shields and cutting the matrix into individual optical units.

28 Claims, 3 Drawing Sheets

OPTICAL TRANSDUCERS AND METHODS OF MAKING SAME

FIELD AND BACKGROUND OF THE INVENTION

The present invention relates to optical transducers (sometimes referred to as optical sensors) which utilize optical means for sensing mechanical displacements, such as movements of a body or deformation of a membrane, and converting them to electrical signals. The invention also relates to methods of making such optical transducers. The invention is particularly useful in making optical microphones, for converting sound into electrical signals, and is therefore described below especially with respect to this application.

Optical transducers of this type are described, for example, in U.S. Pat. Nos. 5,771,091; 5,969,838; 6,091,497; and 6,239,865, the contents of which patents are incorporated herein by reference.

Such optical transducers generally include an optical unit containing a light source, a laterally spaced light detector, an optical shield between the light source and light detector, and a displaceable member aligned with the optical window defined by the light source, light detector, and optical shield between them. The displaceable members in the optical transducers described in the above patents are generally in the form of deformable membranes, but may be physically movable members, such as in an accelerometer. Optical transducers of this type can be constructed to be very accurate for measuring very small displacements.

In general, the known optical transducers do not readily lend themselves to low-cost mass production, and therefore are relatively expense to produce. One particularly troublesome problem for low-cost mass production of such optical transducers is the need to have the optical shield extremely thin and precisely located with respect to the light source and light detector. An extremely thin optical shield is needed in order to minimize shading and maximize the effective surface of the light source and light detector exposed in the optical window to produce a maximum sensitivity to the displacements of the displaceable member. In the prior art constructions, such an optical shield was generally provided by using a thin metal foil, e.g., of aluminum but the introduction of such a thin metal foil does not lend itself to mass-production or automated processes.

OBJECTS AND BRIEF SUMMARY OF THE INVENTION

One object of the present invention is to provide a method of producing optical transducers in a manner which permits mass production at relatively low cost. Another object of the invention is to provide a novel optical transducer of an efficient construction which maximizes the effective surfaces of the light source and light detector exposed in the optical window of the transducer.

According to one aspect of the present invention, there is provided an optical transducer, comprising: a base member; a light source carried on a face of the base member; a light detector carried on the face of the base member laterally spaced from the light source; an optical shield extending from the face of the base member between the light source and light detector; and a displaceable member overlying, and spaced from, the light source, light detector and optical shield, and effective to reflect light from the light source to the light detector; the optical shield being constituted of a transparent plate extending from the face of the base member between the light source and light detector and carrying a thin layer of a light-blocking material to shield the light detector from direct exposure to the light source.

As will be described more particularly below, such an optical transducer readily lends itself to mass-production. It also minimizes the shading effect of the light detector and maximizes the effective surface of the light source and light detector exposed in the optical window, thereby improving the sensitivity of the optical transducer to the displacements of the displaceable member.

According to further features in the preferred embodiment of the invention described below, the transparent plate of the optical shield is fixed within a groove formed in the face of the base member between the light source and light detector. Preferably, the groove is less than one-half the thickness of the base member. The light source, light detector, and optical shield are all embedded in a transparent plastic potting material.

According to another aspect of the present invention, there is provided a method of making an optical transducer comprising: providing a light source and a light detector on a face of a base member, with the light detector spaced laterally from the light source; and fixing to the face of the base member, between the light source and light detector, an optical shield including a transparent plate carrying a thin layer of a light-blocking material to extend between the light source and light detector, and thereby to shield the light detector from direct exposure to the light source. The light source, light detector and optical shield are then embedded in a transparent plastic potting material.

According to a still further aspect of the present invention, there is provided a method of making optical transducers, comprising: applying to a face of a base member a plurality of pairs of light sources and light detectors, with each light detector spaced laterally of the light source of the respective pair; fixing to the face of the base member an elongated strip of transparent material extending between the light sources and light detectors of all the pairs, the transparent strip carrying a thin layer of a light-blocking material on one of its sides; embedding a transparent material over said light sources, said light detectors and said transparent strip with light blocking material on one of its side and cutting the base member into individual optical units each including a light source, a light detector spaced laterally from the light source of the respective pair, and a section of the elongated strip, the section constituting an optical shield between the light source and light detector of the respective pair to shield the respective light detector from direct exposure to the light source of the respective pair.

The plurality of light sources, light detectors and elongated strips are embedded in a transparent plastic potting material before the base member is cut into the individual optical units.

According to still further features in the described preferred embodiment, a deformable membrane is mounted to the outer end of the transparent plastic potting material to overlie, and to be spaced from, the light source, light detector and optical shield.

Preferably, the base member is a printed circuit board which includes the electrical connections to the light sources and light detectors.

As will be described more particularly below, the foregoing features not only permit the optical units of the transducers to be produced in volume and at low cost, but also provide an efficient construction maximizing the effective surfaces of the light source and light detector exposed to the displaceable member.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF A PRIOR ART CONSTRUCTION (FIG. 1)

Figure 1:
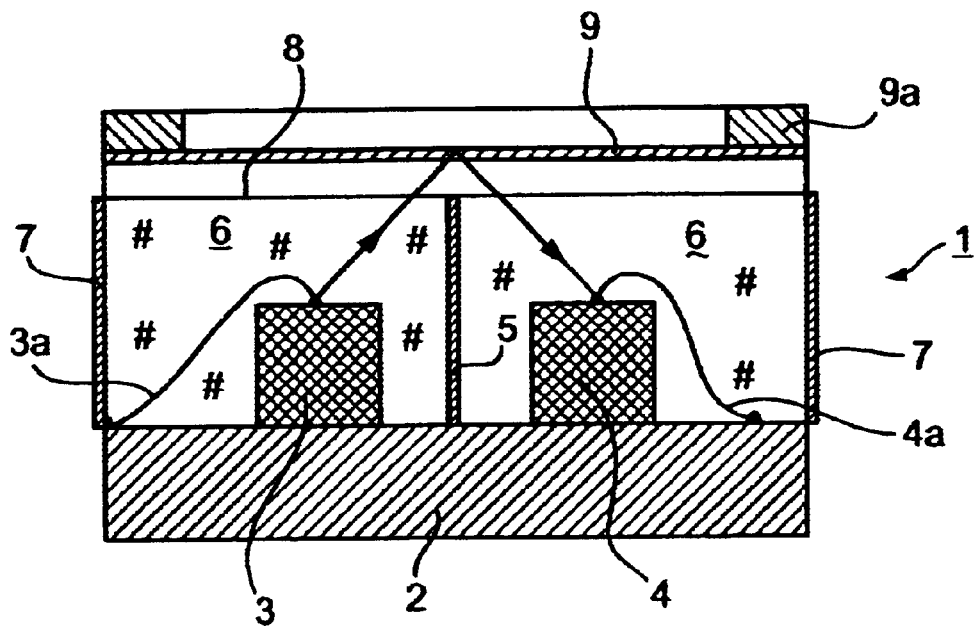
FIG. 1 is a sectional view schematically illustrating one construction of an optical transducer as known in the prior art.

The prior art optical transducer schematically illustrated in FIG. 1 includes a base member 2 mounting a light source 3 and a light detector 4 in spaced side-by-side relation. The light source 3 and light detector 4 are optically shielded from each other by a light-blocking member 5, all embedded within a transparent plastic potting material 6.

The outer surface of the transparent plastic potting material 6 carries an external light shielding layer 7, e.g., of a light-reflecting material, such as a film of aluminum or gold, except for the outer face 8 of the transparent plastic potting material 6 overlying the light source 3, light detector 4, and the optical shield 5 between them. The outer face 8 defines an optical window. External light shielding layer 7 optically isolates the light detector 4 from light in the external environment, as well as blocking the passage of light from light source 3 to the external environment.

A displaceable member, in the form of a deformable membrane 9, is mounted by a mounting ring 9a in optical window 8 to overlie the light source 3, the light detector 4, and the light-blocking member 5 embedded in the transparent plastic potting material 6. The surface of membrane 9 facing the optical window 8 is made light-reflecting, so as to reflect the light from the light source 3 back to the light detector 4. It will be appreciated that the light is emitted from light source 3 in all directions and is refracted at the interface between the plastic body 6 and the air gap to the diaphragm 9, such that a substantial amount of the emitted light impinges membrane 9 at an angle, and is thereby reflected back to the light detector 4, as indicated by the arrows in FIG. 1.

The common base may be a printed circuit board (PCB) carrying the electrical connections 3a, 4a to the light source 3 and light detector 4, respectively. Light source 3 may be any suitable light source, such as a light-emitting diode (LED), and light detector 4 may be any suitable light detector, such as a photo diode. Membrane 9 may be any other displaceable body effective to reflect light from light source 3 to light detector 4 in accordance with its changing position or changing configuration. Light-blocking member 5 may carry a light-reflecting coating similar to layer 7.

It will be seen that the light sources and the light detector 4 are optically isolated from each other and from the external environment on all surfaces thereof except for the optical window 8 receiving the membrane 9. Thus, the light from light source 3 is reflected from the inner surface of the membrane 9 towards the light detector 4, such that any displacement of the membrane will change the intensity of the light received by the light detector. Accordingly, the light received by the light detector 4 is converted to an electrical signal corresponding to the deformations of membrane 9 and output via electrical connection 4a.

As described in the above-cited patents, optical transducers as illustrated in FIG. 1 are usable in a wide variety of applications involving the detection or measurement of micro-movements or macro-movements, such as in the construction of microphones, hydrophones, accelerometers, pressure/vacuum gauges, temperature sensors, displacement meters, etc.

As indicated earlier, such optical transducers, however, require extremely high precision in the manufacture and assembly of their respective parts, since very small dimensional errors can have a large affect on their sensitivity and reliability. This is particularly true with respect to the optical shield 5 which must be very thin and very accurately located. For these reasons, it is very difficult to produce such optical transducers in volume and at relatively low cost.

DESCRIPTION OF A PREFERRED EMBODIMENT OF THE PRESENT INVENTION (FIGS. 2–5)

Figure 2:
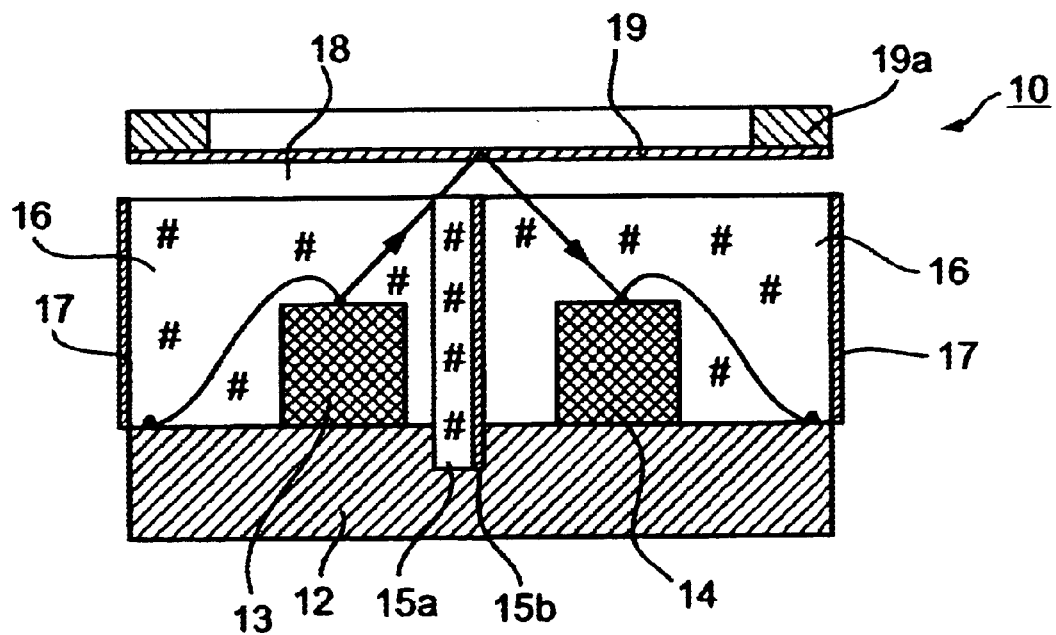
FIG. 2 illustrates an optical transducer of similar structure as shown in FIG. 1 but modified in accordance with the present invention.

FIG. 2 schematically illustrates an optical transducer of the general type shown in FIG. 1 but modified in accordance with the present invention to provide the advantages of the present invention. An important modification is that, instead of forming the optical shield (6, FIG. 1) as a separate layer between the light source and the light detector, as in the prior art construction of FIG. 1, the light shield is in the form of a thin layer of a light-blocking material on a transparent plate, which transparent plate is fixed to the base member between the light source and light detector. As will be described more particularly below, these features, as well as other features of the present invention, permit highly-sensitive optical transducers to be produced in volume and at relatively low cost utilizing mass production techniques.

The optical transducer 10 illustrated in FIG. 2 is produced as follows:

First, the base member 12 (corresponding to base member 2 in FIG. 1) is formed with a groove 12a (FIG. 2) between the light source 13 and light detector 14 (corresponding to light source 3 and light detector 4 in FIG. 1). Groove 12a may be formed either before or after the application of the light source 13 and light detector 14, and is formed at a depth of one-half or less the thickness of the base member 12.

Figure 4:
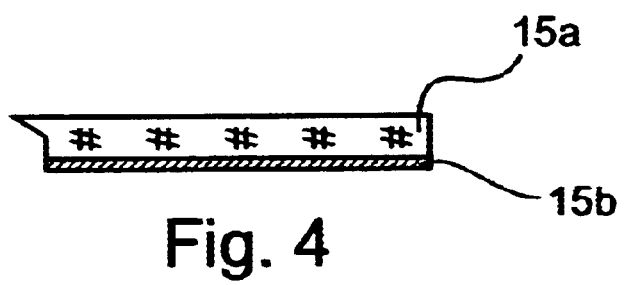
FIG. 4 illustrates the construction of the optical shield.

The optical shield, corresponding to shield 5 in FIG. 1, is constituted of a transparent plate 15a carrying a thin layer of a light-blocking material 15b on one face, as shown on FIG. 4. The transparent plate 15a, carrying the thin layer of light-blocking material 15b, is fixed within groove 12a of base member 12, such that it extends between the light source 13 and light detector 14, with the thin layer of light-blocking material 15b shielding the light detector 14 from direct exposure to the light source 13.

The light source 13 and light detector 14, together with the optical shield 15 between them, are then embedded in a transparent plastic potting material 16, such as an epoxy resin. A thin layer of light blocking material 17 is then applied to the outer surface of the transparent plastic potting material 16, except for one face defining an optical window 18 corresponding to optical window 8 in FIG. 1.

A deformable membrane 19 is then mounted, by a mounting ring 19a, to the outer face of the transparent plastic potting material 16 in alignment with the optical window 18 such that the membrane is deformable towards and away from the exposed face of the light source 13 and light detector 14 to modulate the intensity of the light received by the light detector.

Since the optical shield 15 is in the form of a thin coating of a light blocking material 15d on a plate 15a, it can be conveniently applied to the base member by automated processes; and since the carrier plate is transparent, the provision of such an optical shield still permits maximizing the effective surfaces of the light source and light detector exposed in the optical window 18 to produce a maximum sensitivity to the displacements of the deformable membrane 19.

Preferably, the light blocking material 15b carried by the transparent plate 15a of the optical shield 15, as well as the light blocking material 17 carried on the outer surface of the transparent plastic potting material 16, are both light-reflecting coatings, such as films of aluminum or gold. The base member 12 may be a printed circuit board which includes the electrical connections to the light source 13 and light detector 14.

Figure 5:
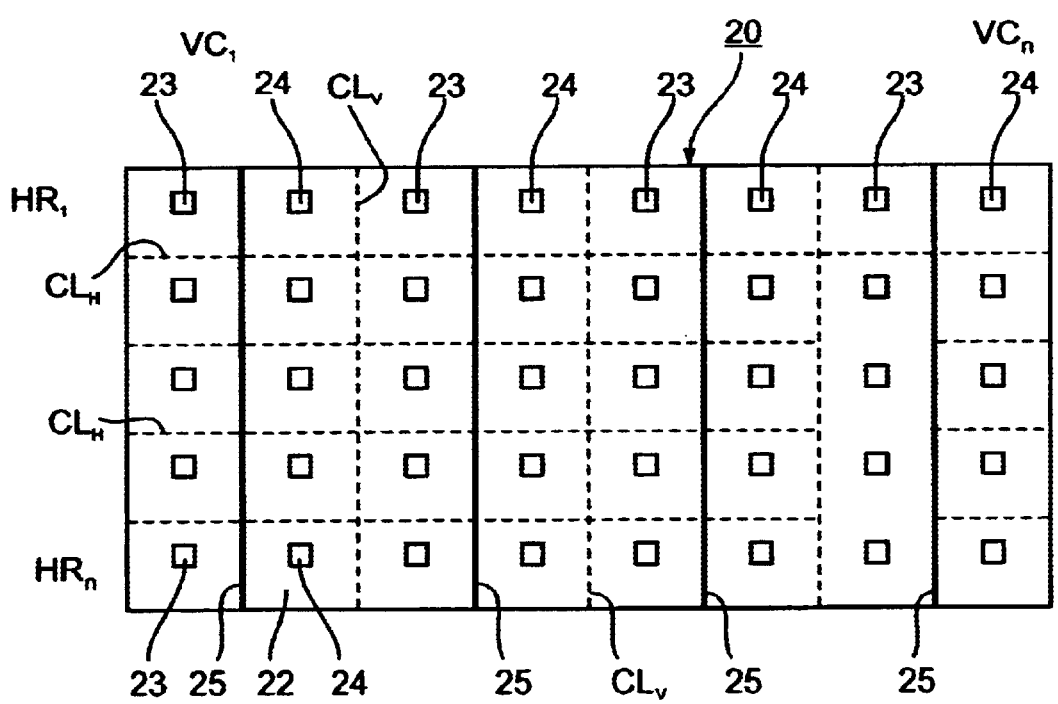
FIG. 5 illustrates an intermediate matrix produced in a high-volume low-cost method of manufacturing optical transducers according to FIGS. 2–4 before such intermediate matrix is cut into individual optical units.

FIG. 5 illustrates one manner of producing such optical transducers according to a mass-production technique, and particularly the intermediate matrix, therein generally designated 20, produced at an intermediate stage in the manufacture of such optical transducers.

Thus, as shown in FIG. 5, the intermediate matrix 20 is produced by applying to a face of a base member 22 a plurality of pairs of light sources 23 and light detectors 24, with each light detector 24 spaced laterally from the light source 23 of the respective pair. The plurality of pairs are arrayed according to a rectangular matrix including a plurality of horizontal rows $HR_1$–$HR_n$ and a plurality of vertical columns $VC_1$–$VC_n$.

Figure 3:
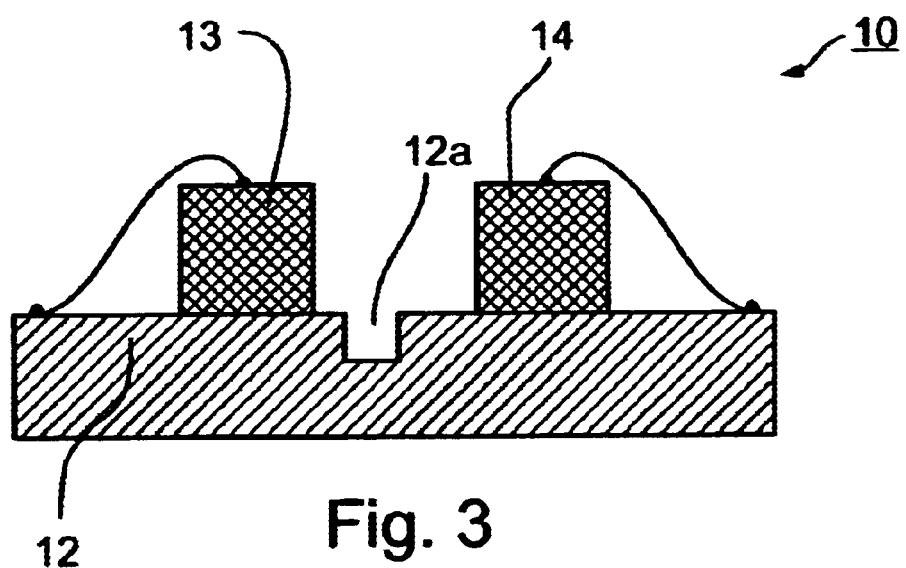
FIG. 3 illustrates the base member of the optical transducer of FIG. 2 after the light source and light detector have been applied, but before the optical shield has been applied.

Before the light sources 23 and light detectors 24 are applied to the base member 22, the base member is formed with a plurality of the grooves (corresponding to groove 12a, FIG. 3), extending in the spaces between the light source 23 and light detector 24 of each pair. An elongated strip 25 is then fixed within those grooves. Elongated strip 25 is of the same construction as described above with respect to FIG. 4, except that it is of a length to extend completely across the base member 22 between the light sources 23 and light detectors 24 in every other vertical column so as to be between a light source 23 and light detector 24 of each pair.

The transparent plastic potting material, corresponding to potting material 16 in FIG. 2, is then applied to embed all the light sources 23, light detectors 24, and optical shields 25, as shown in FIG. 2. The matrix 20 is then cut along the horizontal cut lines $CL_H$ and vertical cut lines $CL_V$, to produce a plurality of individual optical units, each according to FIG. 2. A thin layer of a light-blocking material, corresponding to layer 12 in FIG. 2, is then applied to the outer surfaces of the transparent plastic potting material at each optical unit except for the face to define the optical window 18.

A deformable membrane, corresponding to membrane 19 in FIG. 2, is then mounted to each optical unit by means of a mounting ring corresponding to ring 19a in FIG. 2.

As indicated earlier, such method produces a very strong construction of the optical transducer, permits very exact placement of the optical shield, namely the light-blocking layer 15b, and enables the production of such optical transducers according to mass production techniques.

While the invention has been described with respect to one preferred embodiment, it will be appreciated that this is set forth merely for purposes of example, and that many other variations, modifications and applications of the invention may be made.

What is claimed is:

1. An optical transducer, comprising:
    a base member;
    a light source carried on a face of said base member;
    a light detector carried on said face of the base member laterally spaced from said light source;
    an optical shield extending from said face of the base member between said light source and light detector;
    and a displaceable member overlying, and spaced from, said light source, light detector and optical shield, and effective to reflect light from said light source to said light detector;
    said optical shield including a transparent plate extending from said face of the base member between said light source and light detector, and carrying a thin layer of a light-blocking material to shield the light detector from direct exposure to said light source.

2. The optical transducer according to claim 1, wherein said transparent plate of the optical shield is fixed within a groove formed in said face of the base member between said light source and light detector.

3. The optical transducer according to claim 2, wherein said groove is less than one-half the thickness of said base member.

4. The optical transducer according to claim 1, wherein said light source, light detector, and optical shield are covered by a light-transparent layer.

5. The optical transducer according to claim 4, wherein said light-transparent layer is a transparent plastic potting material embedding said light source, light detector and optical shield.

6. The optical transducer according to claim 5, wherein said thin layer of light-blocking material carried on said transparent plate is a light-reflecting material.

7. The optical transducer according to claim 5, wherein the outer surface of said transparent plastic potting material carries a thin layer of a light-blocking material to block the exit of light from the light source externally of the optical transducer, and to block the entry of external light into the optical transducer on all surfaces except that facing the displaceable member.

8. The optical transducer according to claim 1, wherein said displaceable member is a deformable membrane deformable towards and away from said light source and light detector.

9. The optical transducer according to claim 8, wherein said deformable membrane is mounted on said optical transducer by a mounting ring.

10. The optical transducer according to claim 1, wherein said base member is printed circuit board including electrical connections to said light source and light detector.

11. A method of making an optical transducer, comprising:
    providing a light source and a light detector on a face of a base member, with the light detector spaced laterally from said light source;

and fixing to said face of the base member, between said light source and light detector, an optical shield including a transparent plate carrying a thin layer of a light-blocking material to extend between said light source and light detector, and thereby to shield the light detector from direct exposure to said light source.

12. The method according to claim 11, wherein said light source, light detector, and optical shield are embedded in transparent plastic potting material.

13. The method according to claim 12, wherein said transparent plate of the optical shield is fixed within a groove formed in said face of the base member between said light source and light detector.

14. The method according to claim 13, wherein said groove is less than one-half the thickness of said base member.

15. The method according to claim 12, wherein a thin layer of a light-blocking material is applied to the outer surface of said transparent plastic potting material to block the exit of light from the light source externally of the optical transducer, and to block the entry of external light into the optical transducer, except for a surface of said transparent plastic potting material defining an optical window.

16. The method according to claim 15, wherein said light-blocking material carried on said transparent plate of the optical shield, and said light-blocking material carried on the outer surface of said transparent plastic potting material, are both of a light-reflecting material.

17. The method according to claim 15, wherein said base member is printed circuit board including electrical connections to said light source and light detector.

18. The method according to claim 15, wherein a deformable membrane is mounted to the said transparent plastic potting material in alignment with said optical window.

19. The method according to claim 18, wherein said deformable membrane is mounted by a mounting ring received over the outer end of said transparent plastic potting material.

20. A method of making optical transducers, comprising:
applying to a face of a base member a plurality of pairs of light sources and light detectors, with each light detector spaced laterally of the light source of the respective pair;
fixing to said face of the base member an elongated strip of transparent material extending between the light sources and light detectors of all said pairs, said transparent strip carrying a thin layer of a light-blocking material;
and cutting said base member into individual optical units each including a light source, a light detector spaced laterally from the light source of the respective pair, and a section of said elongated strip, said section constituting an optical shield between the light source and light detector of the respective pair to shield the respective light detector from direct exposure to the light source of the respective pair.

21. The method according to claim 20, wherein said plurality of pairs of light sources and light detectors and the elongated strip are embedded in a transparent plastic potting material before the base member is cut into the individual optical units.

22. The method according to claim 21, wherein said plurality of pairs of light sources and light detectors are arrayed on said face of the base member in a rectangular matrix of a plurality of rows along a first orthogonal axis, and a plurality of columns along a second orthogonal axis; said base member being cut along both said orthogonal axes to produce said individual optical units.

23. The method according to claim 21, wherein said transparent strip is fixed within a groove formed in said face of the base member between said light sources and light detectors.

24. The method according to claim 23, wherein said groove is less than one-half the thickness of said base member.

25. The method according to claim 21, wherein a thin layer of a light-blocking material is applied to the outer surface of said transparent plastic potting material to block the exit of light from the light source externally of the optical transducer, and to block the entry of external light into the optical transducer, except for a surface of said transparent plastic potting material defining an optical window.

26. The method according to claim 25, wherein said light-blocking material carried on a surface of said transparent strip, and said light-blocking material carried on the outer surface of said transparent plastic potting material, are both of a light-reflecting material.

27. The method according to claim 25, wherein said base member is a printed circuit board including electrical connections to said light source and light detector.

28. The method according to claim 25, wherein, after the base member is cut into the individual optical units, a deformable membrane is mounted to the outer end of said transparent plastic potting material of each optical unit in alignment with said optical window thereof.

* * * * *